(12) United States Patent
Kelber (10) Patent No.: US 9,761,660 B2
(45) Date of Patent: Sep. 12, 2017

(54) MANUFACTURABLE SPIN AND SPIN-POLARON INTERCONNECTS

(71) Applicant: THE UNIVERSITY OF NORTH TEXAS, Denton, TX (US)

(72) Inventor: Jeffry Kelber, Denton, TX (US)

(73) Assignee: UNIVERSITY OF NORTH TEXAS, Denton, TX (US)

(*) Notice: Subject to any disclaimer, the term of this patent is extended or adjusted under 35 U.S.C. 154(b) by 0 days.

(21) Appl. No.: 14/606,085

(22) Filed: Jan. 27, 2015

(65) Prior Publication Data
US 2015/0214156 A1 Jul. 30, 2015

Related U.S. Application Data

(60) Continuation of application No. 14/188,736, filed on Feb. 25, 2014, now Pat. No. 9,614,149, which is a
(Continued)

(51) Int. Cl.
| | |
|---|---|
| *H01L 21/02* | (2006.01) |
| *H01L 29/06* | (2006.01) |
| *H01L 23/532* | (2006.01) |
| *H01L 29/16* | (2006.01) |
| *H01L 29/66* | (2006.01) |
| *H01L 29/49* | (2006.01) |
| *H01L 43/14* | (2006.01) |

(52) U.S. Cl.
CPC ........ *H01L 29/0669* (2013.01); *H01L 23/532* (2013.01); *H01L 29/1606* (2013.01); *H01L 29/4908* (2013.01); *H01L 29/66742* (2013.01); *H01L 43/14* (2013.01); *H01L 2924/0002* (2013.01)

(58) Field of Classification Search
CPC ......... H01L 29/0669; H01L 2924/0002; H01L 2924/00; H01L 29/66984; H01L 29/1606; H01L 29/4908; H01L 29/78603; H01L 43/14; H01L 29/78684; H01L 29/66742
USPC ......... 257/295, 29, 30, E21.436, E29.255, 2; 257/E23.001; 438/57, 69, 73, 624
See application file for complete search history.

(56) References Cited

U.S. PATENT DOCUMENTS

| | | | | |
|---|---|---|---|---|
| 6,355,953 B1* | 3/2002 | Kirczenow | ....... | H01L 29/66984 257/295 |
| 8,378,329 B2* | 2/2013 | Zaliznyak | .............. | B82Y 25/00 257/2 |

(Continued)

*Primary Examiner* — Thinh T Nguyen
(74) *Attorney, Agent, or Firm* — Steven B. Kelber (57) ABSTRACT

Manufacturable spin and spin-polaron interconnects are disclosed that do not exhibit the same increase in resistivity shown by Cu interconnects associated with decreasing linewidth. These interconnects rely on the transmission of spin as opposed to charge. Two types of graphene based interconnect approaches are explored, one involving the injection and diffusive transport of discrete spin-polarized carriers, and the other involving coherent spin polarization of graphene charge carriers due to exchange interactions with localized substrate spins. Such devices are manufacturable as well as scalable (methods for their fabrication exist, and the interconnects are based on direct growth, rather than physical transfer or metal catalyst formation). Performance at or above 300 K, as opposed to cryogenic temperatures, is the performance criteria.

8 Claims, 6 Drawing Sheets

Related U.S. Application Data division of application No. 13/343,970, filed on Jan. 5, 2012, now Pat. No. 8,748,957.

(60) Provisional application No. 61/932,288, filed on Jan. 28, 2014.

(56) References Cited

U.S. PATENT DOCUMENTS

| | | | |
|---|---|---|---|
| 9,368,177 B2* | 6/2016 | Suh | G11C 11/161 |
| 2006/0186433 A1* | 8/2006 | Kasai | B82Y 25/00 |
| | | | 257/108 |
| 2010/0109712 A1* | 5/2010 | Zaliznyak | B82Y 25/00 |
| | | | 327/100 |
| 2012/0176831 A1* | 7/2012 | Xiao | G11C 13/0007 |
| | | | 365/148 |
| 2014/0151771 A1* | 6/2014 | Chen | H01L 43/12 |
| | | | 257/295 |
| 2014/0299839 A1* | 10/2014 | Shepard | H01L 29/1606 |
| | | | 257/29 |
| 2015/0131371 A1* | 5/2015 | Suh | G11C 11/161 |
| | | | 365/158 |
| 2016/0016814 A1* | 1/2016 | Marshak | C01G 37/00 |
| | | | 423/596 |

* cited by examiner

MANUFACTURABLE SPIN AND SPIN-POLARON INTERCONNECTS

PRIORITY DATA AND INCORPORATION BY REFERENCE

This application claims benefit of priority to U.S. Provisional Patent Application No. 61/932,288 filed Jan. 28, 2014, as well as U.S. patent application Ser. No. 14/188,736, which in turn claims benefit of the filing of U.S. Pat. No. 8,748,957 filed Jan. 5, 2012, all of which are incorporated by reference in their entirety.

BACKGROUND OF THE INVENTION

Introduction

We describe herein the manufacturability and performance of graphene-based spin and spin-polaron interconnects as a function of interconnect line width (W) and length (L), at or above room temperature. This effort reflects a combination of surface chemistry and growth studies with advanced patterning and charge transport measurements and spin transport and polarization studies. The objectives are threefold:

1) We demonstrate the formation of graphene/dielectric heterostructures by manufacturable methods, including molecular beam epitaxy (MBE), atomic layer deposition (ALD), and plasma-enhanced chemical vapor deposition (PECVD). We have demonstrated the fabrication of such heterostructures previously, including graphene/BN formation [1], and graphene/Co3O4 formation [2].

2) We demonstrate the patterning of such structures for interconnect applications, with systematically varied W and L, using advanced lithographic methods.

Figure 1:
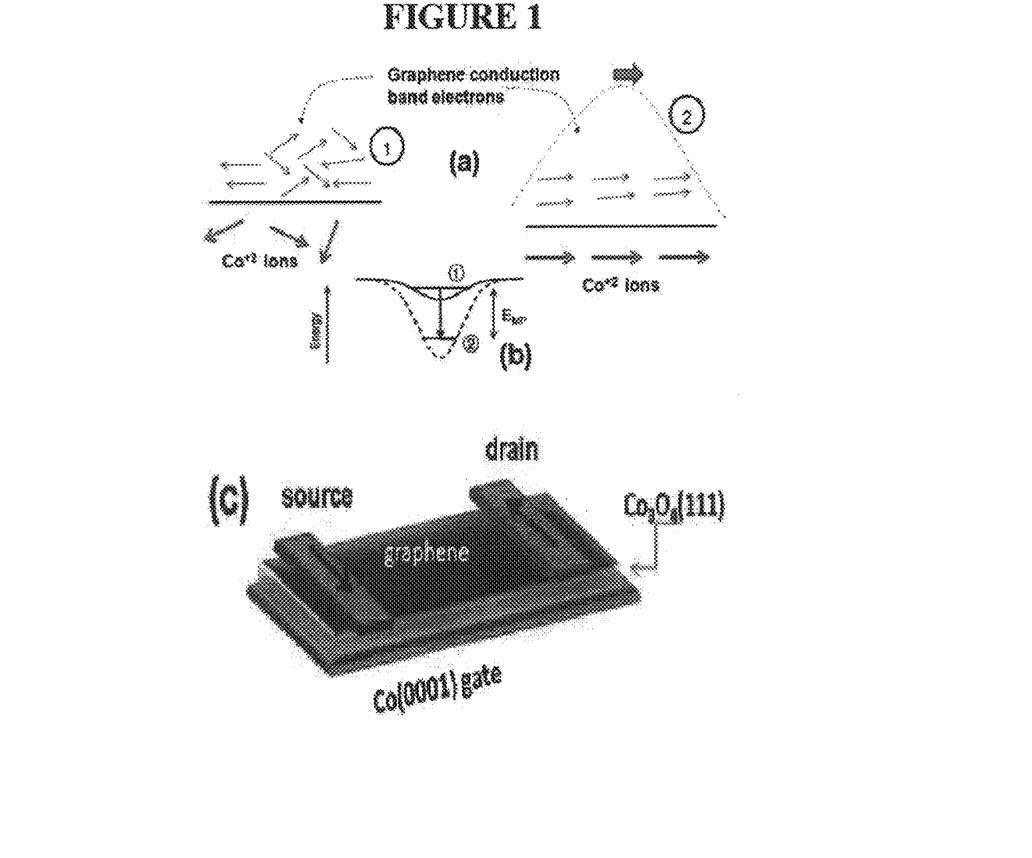
FIG. 1 illustrates spin polaron formation. (a) Interfacial spin exchange interactions between graphene carriers and localized substrate spins (1) induce uniform carrier polarization—spin polarons (2); (b) The spin polarized state is stabilized relative to the ground state by interfacial exchange; (c) A spin valve/interconnect structure involving graphene/$Co_3O_4$/Co trilayer.

3) We illustrate the measurement of charge and spin transport and related magnetic behaviors as function of interconnect W and L, for both diffusive spin transport and magnetic polaron spin transport (FIG. 1). Importantly, these measurements focus on performance at or above 300 K, rather than at cryogenic temperatures.

"Interconnects" or interconnections are the lines of conductive material printed or deposited to provide for electrical connection between electrically isolated or insulated devices or units that, once connected, form a "printed circuit." Conventional SiCMOS based printed circuits have adopted copper interconnect technology. The precipitous increase in Cu interconnect resistivity with decreasing linewidth [3] poses a fundamental obstacle to continued complementary metal oxide semiconductor (CMOS) technology scaling. Recent findings, however, concerning long spin diffusion lengths at 4.2 K (~4-100 μm) in graphene [4-6] support a beyond-Cu/CMOS interconnect architecture based on the transmission of spin, rather than charge.

"Conventional" graphene-based spintronics involves the injection and diffusive transport of discrete spin-polarized carriers [6]. Such devices are, as with conventional interconnects, impacted by sidewall scattering of discrete carriers [7]. While the magnetoresistance, being a ratio of conductances, might scale to smaller linewidths and unpolarized conductances, and exhibit lower energy usage characteristics [8] recent modeling suggests that such diffusive spin transport interconnects would display enhanced resistance at smaller W [7].

Spin polaron transport, as shown schematically in FIG. 1, involves the coherent spin polarization of graphene charge carriers due to exchange interactions with localized substrate spins (e.g., $Co_3O_4$) as in FIG. 1a. This results in formation of a "spin polaron" state stabilized relative to the system ground state by these exchange interactions (FIG. 1b). Such interactions occur in $Mn^{+2}$-doped CdTe quantum wells [9], and have recently been indicated in graphene/$Co_3O_4$/Co (0001) heterostructures, at and above 300 K [10] (FIG. 1c). Since such spin polarons are manifested due to interfacial exchange interactions, they should be relatively unaffected by sidewall scattering. Indeed, preliminary calculations indicate the maintenance of such spin polarons to W~50 nm, and possibly to much smaller dimensions. This is in contrast to Cu interconnects, where significant increases in resistance are observed at or below W~80 nm [3].

We compare herein the different responses of diffusive vs. magnetic polaron spin transport to sidewall scattering at small W and large L. Additionally, we explore the potential for novel, hybrid structures combining traditional interconnect and switching functions, with the potential for truly innovative spin-based architectures that differ qualitatively from Cu/Si/CMOS. The potential of graphene-based spin devices for high speed/low power device applications has recently been modeled [8]. The ability of graphene-based structures to combine both interconnect/device/memory capabilities into new, disruptive hybrid functionalities provides an additional and powerful motivation for the proposed research.

Related Art

The references cited at the end of this specification are identified largely for the purposes of illustrating the problems and the structures of the prior art. It is only in the context of such prior art that the interconnect advance of this case can be properly understood. Nonetheless, the disclosures of these references may be helpful in understanding how to properly form and use the inventive subject matter disclosed herein, and to that extent, they are incorporated herein-by-reference.

SUMMARY OF THE INVENTION

A principle concern in the industry as it looks to alternatives for conventional SI-CMOS structures and processes is the manufacturability of graphene-based structures by direct growth (no physical transfer or metal catalyst) on dielectric/metal and dielectric/ferromagnetic substrates. Importantly, we have already demonstrated such capability for graphene single or multilayer films on h-BN(0001)/Ru(0001) (FIG. 2) [1] and on $Co_3O_4$(111)/Co(0001) (FIG. 3) [2]. Importantly, graphene/$Co_3O_4$/Co heterostructures exhibit remarkable antiferromagnetic hysteresis (FIG. 4) up to >400 K, demonstrating unusual graphene-mediated magnetic properties with spintronic applications at practical device operating temperatures [10]. We intend to demonstrate that similar properties are exhibited for other graphene/dielectric/ferromagnetic heterostructures. We also propose and show that such heterostructures can be fabricated into interconnect structures, and the relationship of structure linewidth and other factors to the efficiency of spin polarization/transport at or above 300 K. The impact of this invention will therefore be to demonstrate the manufacturability and potential performance and scalability of such spin interconnects or spin polaron interconnects at realistic operating temperatures.

DESCRIPTION OF THE DRAWINGS

The accompanying drawings, which are incorporated herein and constitute part of this specification, illustrate exemplary embodiments of the invention, and, together with the general description given above and the detailed description given below, serve to explain the features of the invention.

FIG. 6 illustrates in cross-section view the interconnect of this invention. As shown, on a substrate 1000 (which may be silicon) a film 1002 of ferromagnetic material is deposited. A film 1004 of boron nitride at least one atomic layer thick overlays the film 1002. A film 1006 of graphene is formed on layer 1004 of boron nitride.

DETAILED DESCRIPTION OF THE INVENTION

Figure 2:
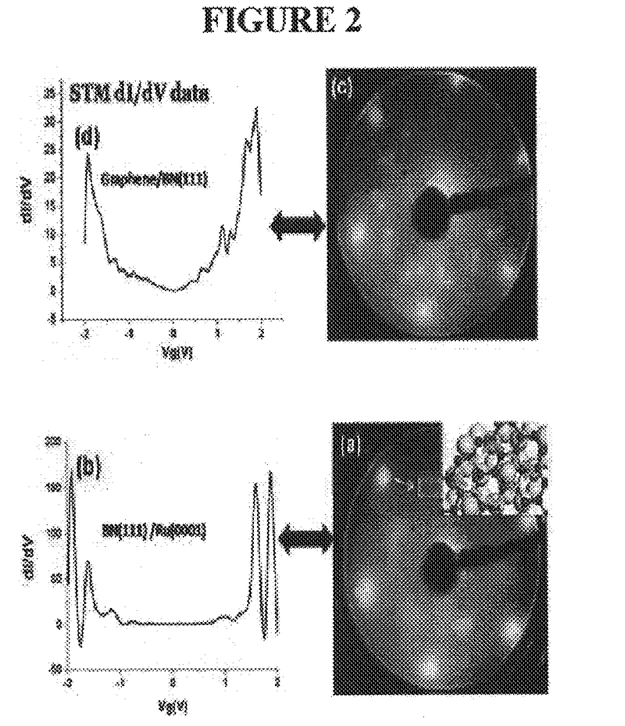
FIG. 2 reflects graphene CVD on ALD BN(0001) on Ru(0001). Low energy electron diffraction (LEED) and STM dI/dV data for BN monolayer (ML) and graphene/BN heterojunctions grown on Ru(0001): (a) LEED image for h-BN(0001)/Ru. Main LEED spots are bifurcated, as shown by enlarged spot image (in red); model at right illustrates R30 (⅓×⅓) unit cell derived from LEED image; (b) corresponding STM dI/dV data showing interfacial orbital hybridization (note features near +/−1 $V_g$ (c) LEED image for graphene/h-BN/Ru(0001), also with orbital hybridization; (d) corresponding STM dI/dV data [1].
Figure 3:
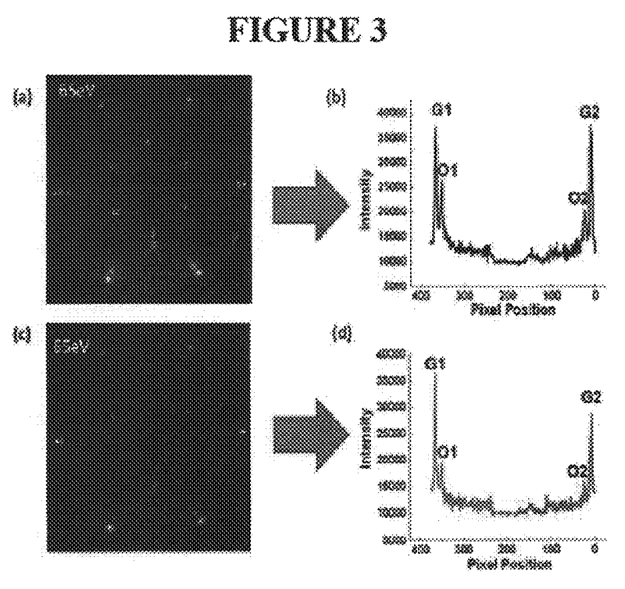
FIG. 3 is LEED and corresponding line scan data for (a,b) 0.4 ML graphene on $Co_3O_4$(111), and (c,d) 3 ML graphene on $Co_3O_4$(111). Arrows (a,c) mark diffraction spots associated with $Co_3O_4$(111), as do inner spots in the outer ring of bifurcated features (e.g., O1, O2—b,d). Outer spots in the outer ring of bifurcated features (e.g., G1, G2—b,d) are graphene-related. LEED beam energy is 65 eV.
Figure 4:
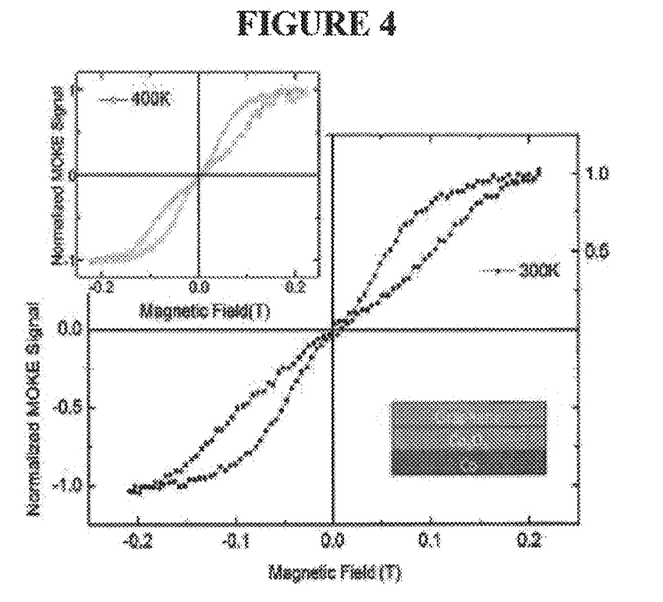
FIG. 4 reflects longitudinal magneto-optic Kerr effect (MOKE) hysteresis of graphene (three layers) on $Co_3O_4$ (111) [1 nm]/Co(0001) [5.6 nm] trilayer measured at T=300 K (solid circles) and 400 K (open circles). Inset of the main panel shows a sketch of the graphene/$Co_3O_4$(111)/Co(0001) trilayer.

Various embodiments will be described in detail with reference to the accompanying drawings. The structures illustrated in the drawings are renderings not photomicrographs. They are intended to be illustrative, not limiting. In contrast, the data of FIGS. 2-4 is verified, and relied on to demonstrate projected performance.

Proposed Interconnects and Related Structures

Figure 5:
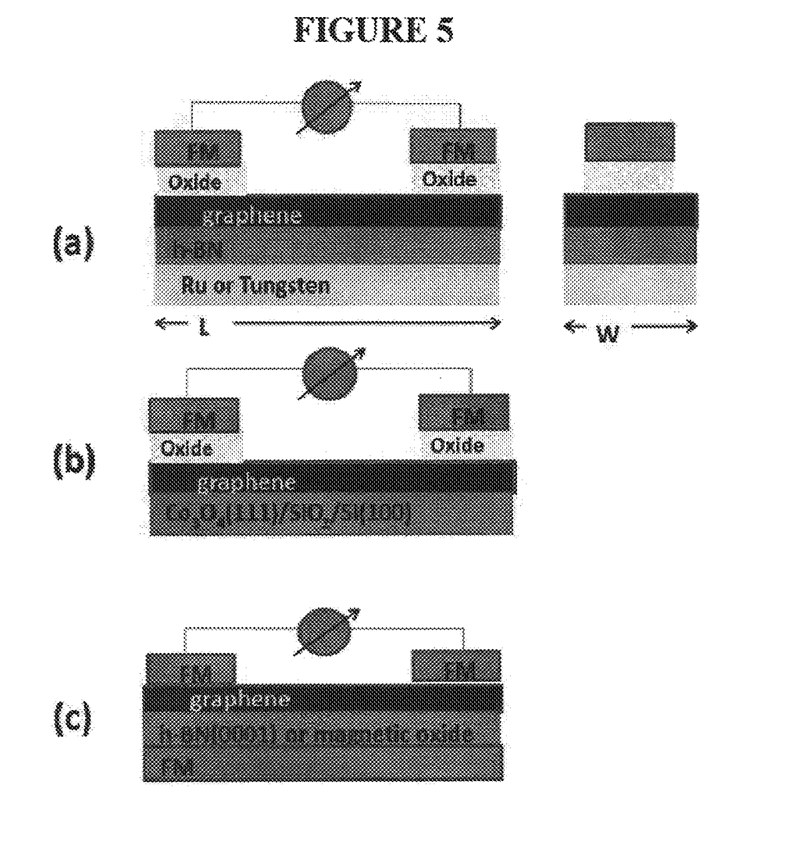
FIG. 5 illustrates three approaches to spin interconnects: (a) graphene/BN/Ru (or, e.g., tungsten) with tunneling-based spin injection/diffusion; (b) graphene interconnects with tunneling-based spin injection/diffusion, integrated on $SiO_2$/Si; (c) magnetic-polaron coherent spin transport, based on polarization of graphene. FM=ferromagnet (Fe, Co, or Ni). Structures will be fabricated of variable length (L) and width (W) as shown in (a).
Figure 6:
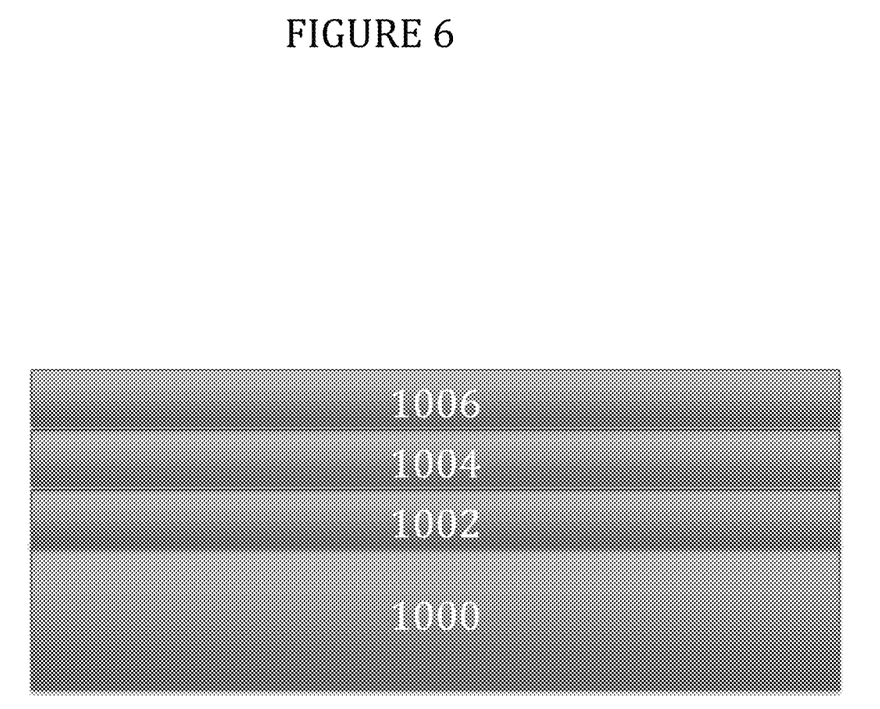

Spin diffusion vs. spin polaron transport Spin interconnect structures are fabricated as shown in FIG. 5. These manufacturable structures demonstrate spin transport by two different methods. The most direct approach, as in FIG. 5a,b, involves the injection/diffusion of discrete spins through graphene [4, 11-16]. The interconnects illustrate the degree to which such discrete spin transport is affected by both spin diffusion vs. length (L, FIG. 5a)) and potential sidewall scattering for decreasing linewidths (W, FIG. 5a), in comparison with existing models [7].

An alternative inventive approach herein to spin transport involves spin polaron formation [9, 17]. Coherent spin polarization and transport can arise from strong RKKY-type exchange interactions between delocalized carriers and localized spins on metal cations, as in CdTe/$Mn^{+2}$ quantum wells [9, 17] and, apparently, in graphene/$Co_3O_4$/Co structures (FIG. 4) [10]. Because the basic phenomenon here is uniform graphene carrier polarization, rather than injection/diffusion of discrete spins, such structures may exhibit more uniform scaling vs. L and W, without L dependent polarization characteristic of discrete spin diffusion [6], and without sidewall-induced scattering characteristic of discrete spin transport.

(1) Spin Injection/Diffusion: Graphene/BN/Ru (or W) Heterostructures (FIG. 5a)

Graphene/BN/Ru heterostructures are readily manufacturable, based on our existing results using ALD to form the BN single layer [1] or multilayers [18], on Ru, followed by graphene CVD [2]. Literature results [19] also suggest the viability of MBE or PVD. Tungsten affords a CMOS-compatible alternative to Ru, with potentially useful interfacial chemical interactions and effects on graphene properties.

(2) Spin Injection/Diffusion—Integration with SiO2/Si (100) (FIG. 5b)

The demonstrated ability to grow (111)-oriented $Co_3O_4$ on $SiO_2$/SiO(100) by PECVD [20] provides a direct route towards the integration of spin interconnects and related structures with Si CMOS. This structure would still operate by tunneling injection/diffusion of discrete spins, although graphene carrier/Co ion RKKY-type interactions [10] may also be observed.

(3) Magnetic Polaron Formation/Transport with Substrate Gating. (FIG. 5c)

Graphene/BN/FM (=Co, Ni, Fe) heterojunctions should exhibit strong interfacial orbital hybridization and charge transfer [1, 21, 22], with important consequences for substrate-induced BN and graphene magnetic behavior [23, 24], including uniform polarization of graphene charge carriers and coherent magnetic polaron spin transport. Such behavior (without interfacial orbital hybridization) has been demonstrated for graphene/$Co_3O_4$/Co structures [10] and likely will also be observed for graphene on other magnetic oxides such as chromia and alumina. Such structures will be fabricated by established methods [2, 18, 19]. These devices will rely on spin transport (magnetoresistance) behavior for longer L and smaller W, and we here demonstrate how spin polaron transport scales in a manner fundamentally different from discrete spin injection/diffusion. Spin transport in this structure may be gated by the ferromagnetic substrate, which would permit switching between different states with large and small magnetoresistance, leading to hybrid interconnect/device structures without analogy in Si-CMOS architecture.

Fabrication of these heterojunctions is accompanied by characterization using an array of surface science methods, including low energy electron diffraction (LEED), Raman, core and valence band photoemission (XPS, UPS), and scanning tunneling microscopy/spectroscopy (STM/STS). Basic magnetic behavior is also be probed by magneto-optic Kerr effect (MOKE) measurements. Interconnect structures with varying L and W (e.g., FIG. 5a) are then produced, coupled with SEM/TEM characterization, and conductivity measurements. Magnetoresistance measurements, coupled with spin-polarized photoemission/inverse photoemission studies will similarly be conducted.

Previous experience showing that graphene-covered heterostructures are largely inert towards ambient exposure for periods of several weeks or longer, makes this invention possible. Incorporation of the interconnect structures permitting shipment of samples between fabrication facilities and assembly points.

Initially, as reflected in FIG. 5a and FIG. 5b—interconnects readily manufacturable based on existing results are made, and spin transport measurements are taken to determine magneto-resistance scaling as a function of interconnect length and width. Decreased conductivity with decreasing W is expected [7].

Various graphene/BN or magnetic oxides/Co heterostructures (FIG. 5c), including the possibility of Co substrate "gating" of interconnect performance is explored as well. Scaling of magnetoresistance with interconnect behavior is compared to results for structures involving spin tunneling injection and diffusion demonstrating improved performance for the heterostructures of the invention.

Structures are then optimized for spin transmission at and above room temperature, and comparisons are made of switching, power usage, durability, and other factors, with variations in structure and interface chemistry as predicted by previous results.

REFERENCES

[1] C. Bjelkevig, Z. Mi, J. Xiao, P. A. Dowben, L. Wang, W. Mei, J. A. Kelber. Electronic structure of a graphene/hexagonal-BN heterostructure grown on Ru(0001) by chemical vapor deposition and atomic layer deposition: Extrinsically doped graphene. J. Phys.: Cond. Matt. 22 (2010) 302002.

[2] M. Zhou, F. L. Pasquale, P. A. Dowben, A. Boosalis, M. Schubert, V. Darakchieva, R. Yakimova, J. A. Kelber. Direct graphene growth on Co3O4(111) by molecular beam epitaxy. J Phys.: Cond. Matt. (2012) 072201.

[3] R. H. Dennard, J. Cai, A. Kumar. A perspective on today's scaling challenges and possible future directions. Sol. St. Electron. 51 (2007) 518-525.

[4] B. Dlubak, M. Martin, C. Deranlot, B. Servet, S. Xavier, R. Mattana, M. Sprinkle, C. Berger, W. A. DeHeer, F. Petroff, A. Anane, P. Seneor, A. Fert. Highly efficient spin transport in epitaxial graphene on SiC. Nat. Phys. 8 (2012) 557-561.

[5] M. H. Guimaraes, A. Veligura, P. J. Zomer, T. Massen, I. J. Vera-Marun, N. Tombros, B. J. van Wees. Spin transport in high quality suspended graphene devices. Nano Lett. 12 (2012) 35123517.

[6] N. Tombros, C. Jozsa, M. Popinciuc, H. T. Jonkman, B. J. van Wees. Electronic spin transport and spin precession in single graphene layers at room temperature. Nature. 448 (2007) 571574.

[7] S. Rakheja, A. Naeemi. Graphene nanoribbon spin interconnects for nonlocal spin-torque circuits: comparison of performance and energy per bit with CMOS circuits. IEEE Trans. Elect. Dev. 59 (2012) 51-59.

[8] D. Nikonov and I. A. Young. Overview of Beyond-CMOS Devices and a Uniform Methodology for their Benchmarking, Proc. IEDM (2013) in press.

[9] D. R. Yakovlev, W. Ossau, G. Landwehr, R. N. Bicknell-Tassius, A. Waag, S. Schmeusser. Two dimensional exciton magnetic polaron in $CdTe/Cd1-_xMn_xTe$. Sol. St. Commun. 82 (1992) 29-32.

[10] Y. Wang, L. Kong, F. L. Pasquale, Y. Cao, B. Dong, I. Tanabe, C. Binek, P. A. Dowben, J. A. Kelber. Graphene mediated domain formation in exchange coupled graphene/Co3O4(111)/Co(0001) trilayers. J Phys: Cond Matt. 25 (2013) 472203.

[11] B. Dlubak, M.-. Martin, C. Deranlot, K. Bouzehouane, S. Fusil, R. Mattana, F. Petroff, A. Anane, P. Seneor, A. Fert. Homogeneous pinhole free 1 nm Al2O3 tunnel barriers on graphene. Appl. Phys. Lett. 101 (2012) 203104.

[12] B. Dlubak, P. Seneor, A. Anane, C. Barraud, C. Deranlot, D. Deneuve, B. Servet, R. Mattana, F. Petroff, A. Fert. Are Al2O3 and MgO tunnel barriers suitable for spin injection in graphene? Appl. Phys. Lett. 97 (2010) 092502.

[13] W. H. Wang, W. Han, K. Pi, K. M. McCreary, F. Miao, W. Bao, C. N. Lau, R. K. Kawakami. Growth of atomically smooth MgO films on graphene by molecular beam epitaxy. Appl. Phys. Lett. 93 (2008) 183107.

[14] W. Han, K. Pi, H. Wang, M. McCreary, Y. Li, W. Bao, P. Wei, J. Shi, C. N. Laun, R. K. Kawakami. Spin transport in graphite and graphene spin valves. Proc. SPIE. 7398 (2009) 739819-1.

[15] W. Han, K. Pi, K. M. McCreary, Y. Li, J. Wong, A. G. Swartz, R. K. Kawakami. Tunneling spin injection into single layer graphene. Phys. Rev. Lett. 105 (2010) 167202.

[16] W. Han, K. M. McCreary, K. Pi, W. H. Wang, Y. Li, H. Wen, J. R. Chen, R. K. Kawakami. Spin transport and relaxation in graphene. J. Mag. and Magnet. Mater. 324 (2012) 369-381.

[17] I. A. Merkulov, D. R. Yakovlev, A. Keller, W. Ossau, J. Geurts, A. Waag, G. Landwehr, G. Karczewski, T. Wojtowicz, J. Kossut. Kinetic exchange between the conduction band electrons and magnetic ions in quantum-confined structures. Phys. Rev. Lett. 83 (1999) 1431-1433.

[18] J. A. Kelber. "Direct graphene growth on dielectric substrates" in Graphene, Carbon Nanotubes and Nanostructures: Techniques and Applications, J. E. Morris and K. Iniewski (CRC Press, Boca Raton, Fla. 2013) 89-113.

[19] T. Lin, Y. Wang, H. Bi, D. Wan, F. Huang, X. Xie, M. Jiang. Hydrogen flame synthesis of few-layer graphene from a solid carbon source on hexagonal boron nitride. J. Mater. Chem. 22 (2012) 2859-2862.

[20] M. E. Donders. H. C. M. Knoops, M. C. M. van de Sanden, W. M. M. Kessels, P. H. L. Notten. Remote plasma atomic layer deposition of $_{Co3O4}$ films. J. Electrochem. Soc. 158 (2011) G92-G96.

[21] A. B. Preobrajenski, A. S. Vinogradov, N. Martensson. Monolayer of h-BN chemisorbed on Cu(111) and Ni(111): The role of the transition metal 3d state. Surf. Sci. 582 (2005) 21-30.

[22] M. Weser, Y. Rehder, K. Horn, M. Sicot, M. Fonin, A. B. Preobrajenski, E. N. Voloshina, E. Goering, Y. S. Dedkov. Induced magnetism of cabon atoms at the graphene/Ni(111) interface. Appl. Phys. Lett. 96 (2010) 012504.

[23] V. M. Karpan, P. A. Khomyakov, G. Giovannetti, A. A. Starikov, P. J. Kelly. Ni(111/graphene/h-BN junctions as ideal spin injectors. Phys. Rev. B 84 (2011) 153406.

[24] O. V. Yazev, A. Pasquarello. Magnetoresistive junctions based on epitaxial graphene and hexagonal boron nitride. Phys. Rev. B 80 (2009) 035408.

What is claimed is:
1. An interconnect for connecting two electrical transistors of an integrated circuit that are otherwise electrically insulated from each other, comprising:
   a film of ferromagnetic material deposited on a substrate;
   a film of boron nitride of at least one atomic layer thickness overlaying said film of ferromagnetic material;

a film of graphene overlaying said film of boron nitride; and wherein said interconnect extends from one of said transistors to a second of said transistors.

2. The interconnect of claim 1, wherein said boron nitride is at least two atomic layers thick.

3. The interconnect of claim 1, wherein said ferromagnetic material is selected from the group consisting of ruthenium, cobalt, nickel, iron and mixtures and alloys thereof.

4. The interconnect of claim 3, wherein said ferromagnetic material comprises cobalt.

5. An interconnect for connecting two electrical transistors of an integrated circuit formed on a silicon base that are otherwise electrically insulated from each other, said interconnect comprising:

a film of ferromagnetic material formed on said base;

a film of a metal oxide overlaying said ferromagnetic material;

a film of graphene overlaying said metal oxide; and wherein said interconnect extends from one of said transistors to a second of said transistors.

6. The interconnect of claim 5, wherein said interconnect further comprises a layer of boron nitride between said magnetic oxide and said graphene.

7. The interconnect of claim 5, wherein said ferromagnetic material is cobalt, and said magnetic oxide is chromia.

8. The interconnect of claim 5, wherein said ferromagnetic material is cobalt, and said magnetic oxide is cobalt oxide.

* * * * *